United States Patent
Wang

(10) Patent No.: US 11,114,644 B2
(45) Date of Patent: Sep. 7, 2021

(54) OLED DISPLAY PANEL AND OLED DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Bo Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 42 days.

(21) Appl. No.: 16/630,446

(22) PCT Filed: Oct. 23, 2019

(86) PCT No.: PCT/CN2019/112647
§ 371 (c)(1),
(2) Date: Jan. 12, 2020

(87) PCT Pub. No.: WO2020/232965
PCT Pub. Date: Nov. 26, 2020

(65) Prior Publication Data
US 2020/0373521 A1    Nov. 26, 2020

(51) Int. Cl.
*H01L 51/52*      (2006.01)
*H01L 27/32*      (2006.01)

(52) U.S. Cl.
CPC ...... *H01L 51/5275* (2013.01); *H01L 27/3244* (2013.01); *H01L 2251/558* (2013.01)

(58) Field of Classification Search
USPC .......................................................... 257/40
See application file for complete search history.

(56) References Cited

U.S. PATENT DOCUMENTS

2007/0182319 A1*   8/2007   Wei ........................... H01J 1/62
                                                                 313/506
2013/0001578 A1*   1/2013   Song ................... H01L 27/1255
                                                                  257/71

(Continued)

FOREIGN PATENT DOCUMENTS

CN          103887441 A      6/2014
CN          104659267 A      5/2015
(Continued)

*Primary Examiner* — Nduka E Ojeh
(74) *Attorney, Agent, or Firm* — Mark M. Friedman

(57) ABSTRACT

The present disclosure provides an OLED display panel and a display device. The OLED display panel includes a substrate, a light-emitting functional layer disposed on the substrate, and at least two optical coupling layers disposed on the light-emitting functional layer, wherein refractive indices of the at least two optical coupling layers are gradually decreased in a direction in which light emits from the light-emitting functional layer. By adjusting an interaction between an angular width and a multiple-beam interference in the OLED display panel, efficiency of optical coupling is improved. Therefore, luminous efficiency of the OLED display panel is greatly improved. Brightness of the OLED display panel is increased, and a lifetime of the OLED display panel is extended.

17 Claims, 2 Drawing Sheets

(56) References Cited

U.S. PATENT DOCUMENTS

| | | | | |
|---|---|---|---|---|
| 2014/0042422 A1* | 2/2014 | Silverman | ........... | H01L 51/5275 |
| | | | | 257/40 |
| 2014/0168778 A1* | 6/2014 | Chen | ...................... | G02B 1/115 |
| | | | | 359/601 |
| 2015/0144890 A1 | 5/2015 | Ma et al. | | |
| 2018/0059478 A1* | 3/2018 | Dong | ...................... | G02F 1/011 |
| 2018/0351132 A1* | 12/2018 | Yuan | ................... | H01L 51/5275 |
| 2021/0226159 A1* | 7/2021 | Guo | ........................ | H01L 51/56 |

FOREIGN PATENT DOCUMENTS

| | | |
|---|---|---|
| CN | 107170903 A | 9/2017 |
| CN | 206595298 U | 10/2017 |

* cited by examiner

OLED DISPLAY PANEL AND OLED DISPLAY DEVICE

FIELD

The present disclosure relates to the field of display and, more particularly, relates to an organic light-emitting diode display panel and a display device.

BACKGROUND

Currently, organic light-emitting diodes (OLEDs) have become one of the most important display technologies because they do not need backlight source and have advantages such as high contrast, ultra-thinness, and light weight. Luminous efficiency of OLED display devices needs to be improved because it plays a vital role in performance of the OLED display devices.

However, luminous efficiency is low in conventional OLED display devices.

Regarding the technical problem: luminous efficiency is low in the conventional OLED display devices and is desired to be improved.

SUMMARY

To solve the problem that luminous efficiency is low in the conventional OLED display devices, technical solutions are described as follows:

The present disclosure provides an OLED display panel, including: a substrate; a light-emitting functional layer disposed on the substrate; and at least two optical coupling layers disposed on the light-emitting functional layer and disposed in a direction in which light emits from the light-emitting functional layer. Refractive indices of the at least two optical coupling layers are gradually decreased in the direction in which light emits from the light-emitting functional layer.

In the OLED display panel provided by the present disclosure, refractive indices of all optical coupling layers are gradually decreased in the direction in which light emits from the light-emitting functional layer.

In the OLED display panel provided by the present disclosure, refractive indices of the at least two optical coupling layers are gradually increased in the direction in which light emits from the light-emitting functional layer.

In the OLED display panel provided by the present disclosure, a total thickness of the at least two optical coupling layers ranges from 50 nm to 120 nm.

In the OLED display panel provided by the present disclosure, the total thickness of the at least two optical coupling layers is 80 nm.

In the OLED display panel provided by the present disclosure, thicknesses of different optical coupling layers are the same.

In the OLED display panel provided by the present disclosure, thicknesses of the at least two optical coupling layers are different.

In the OLED display panel provided by the present disclosure, thicknesses of the at least two optical coupling layers are gradually decreased in the direction in which light emits from the light-emitting functional layer.

In the OLED display panel provided by the present disclosure, thicknesses of the at least two optical coupling layers are gradually increased in the direction in which light emits from the light-emitting functional layer.

In the OLED display panel provided by the present disclosure, material of the at least two optical coupling layers is an organic molecular material.

Furthermore, the present disclosure provides an OLED display device, including an OLED display panel. The OLED display panel includes: a substrate; a light-emitting functional layer disposed on the substrate; and at least two optical coupling layers disposed on the light-emitting functional layer and disposed in a direction in which light emits from the light-emitting functional layer. Refractive indices of the at least two optical coupling layers are gradually decreased in the direction in which light emits from the light-emitting functional layer.

In the OLED display device provided by the present disclosure, refractive indices of all optical coupling layers are gradually decreased in the direction in which light emits from the light-emitting functional layer.

In the OLED display device provided by the present disclosure, refractive indices of the at least two optical coupling layers are gradually increased in the direction in which light emits from the light-emitting functional layer.

In the OLED display device provided by the present disclosure, a total thickness of the at least two optical coupling layers ranges from 50 nm to 120 nm.

In the OLED display device provided by the present disclosure, the total thickness of the at least two optical coupling layers is 80 nm.

In the OLED display device provided by the present disclosure, thicknesses of different optical coupling layers are the same.

In the OLED display device provided by the present disclosure, thicknesses of the at least two optical coupling layers are different.

In the OLED display device provided by the present disclosure, refractive indices of all optical coupling layers are gradually decreased in the direction in which light emits from the light-emitting functional layer.

In the OLED display device provided by the present disclosure, thicknesses of the at least two optical coupling layers are gradually increased in the direction in which light emits from the light-emitting functional layer.

In the OLED display device provided by the present disclosure, material of the at least two optical coupling layer is an organic molecular material.

Regarding beneficial effects: the present disclosure provides an OLED display panel and a display device. The OLED display panel includes a substrate, a light-emitting functional layer disposed on the substrate, and at least two optical coupling layers disposed on the light-emitting functional layer and disposed in a direction in which light emits from the light-emitting functional layer. Refractive indices of the at least two optical coupling layers are gradually decreased in the direction in which light emits from the light-emitting functional layer. A plurality of optical coupling layers with certain thicknesses are disposed on the OLED display panel in the direction in which light emits from the OLED display panel. Refractive indices of the optical coupling layers are gradually decreased. By adjusting an interaction between an angular width and a multiple-beam interference in the OLED display panel, optical coupling efficiency is improved. Therefore, luminous efficiency of the OLED display panel is greatly improved. Brightness of the OLED display panel is increased, drive current and power consumption of the OLED display panel are reduced, and a lifetime of the OLED display panel is significantly extended.

DESCRIPTION OF DRAWINGS

The accompanying figures to be used in the description of embodiments of the present disclosure or prior art will be described in brief to more clearly illustrate the technical solutions of the embodiments or the prior art. Apparently, the accompanying figures described below are only part of the embodiments of the present disclosure, from which those skilled in the art can derive further figures without making any inventive efforts.

DETAILED DESCRIPTION

Figure 1:
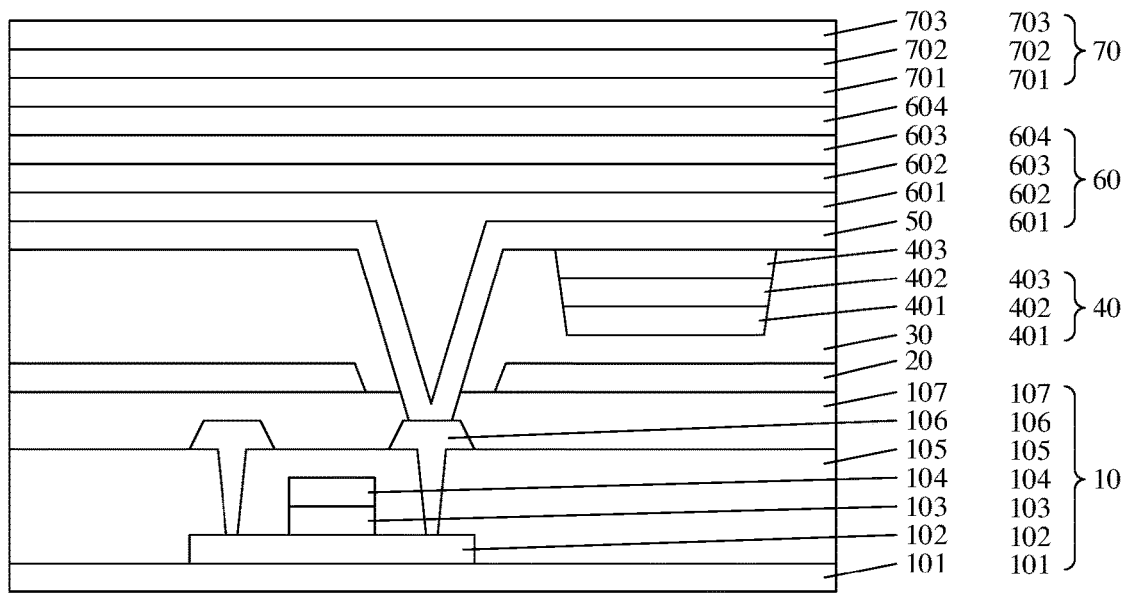
FIG. 1 is a schematic structural diagram of a first OLED display panel provided by an embodiment of the present disclosure.

The following description of the various embodiments is provided with reference to the accompanying drawings. It should be understood that terms such as "upper", "lower", "front", "rear", "left", "right", "inside", "outside", "lateral", as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

With application of novel phosphorescent material, internal quantum efficiency of an OLED can theoretically approach 100%. However, luminous efficiency of OLED devices is still low. Besides conversion efficiency (internal quantum efficiency) of luminous material, low optical coupling efficiency is another important reason that limits luminous efficiency of the OLED devices. An OLED display panel with low luminous efficiency has high power consumption and short lifetime because it requires a large drive current to reach required brightness, which significantly limits practical applications of OLEDs.

To increase optical coupling efficiency of the OLEDs, the present disclosure provides an OLED display panel that can improve the above problems.

The OLED display panel provided by the present disclosure includes top light-emitting OLED display panels and bottom light-emitting OLED display panels. In embodiments of the present disclosure, the top light-emitting OLED display panels are taken for explaining the present disclosure.

In one embodiment, as shown in FIGS. 1 to 4, the OLED display panel provided by the present disclosure includes:

a substrate 10, in the present embodiment, the substrate 10 is a thin film transistor (TFT) substrate, including a substrate 101, a semiconductive active layer 102, a gate insulating layer 103, a gate electrode layer 104, an interlayer insulating layer 105, a source/drain electrode layer 106, and a passivation layer 107, which are disposed in a stack from bottom to top;

a first electrode 20 disposed on the substrate 10;

a pixel defining layer 30 disposed on the first electrode 20;

a light-emitting functional layer 40 disposed on the pixel defining layer 30, including a hole transport layer 401, a luminous material layer 402, and an electron transport layer 403; a second electrode 50 disposed on the light-emitting functional layer 40; at least two optical coupling layers 60 disposed on the second electrode 50, wherein refractive indices of the at least two optical coupling layers 60 are gradually decreased in a direction in which light emits from the light-emitting functional layer 40; and an encapsulation layer 70 disposed on the optical coupling layer 60. The encapsulation layer 70 includes a first non-organic layer 701, an organic layer 702, and a second non-organic layer 703.

In the present embodiment, a plurality of optical coupling layers with certain thicknesses are disposed on the OLED display panel in the direction in which light emits from the OLED display panel. Refractive indices of the optical coupling layers are gradually decreased. By adjusting an interaction between an angular width and a multiple-beam interference in the OLED display panel, efficiency of optical coupling is improved. Therefore, luminous efficiency of the OLED display panel is greatly improved. Brightness of the OLED display panel is increased, drive current and power consumption of the OLED display panel is reduced, and a lifetime of the OLED display panel is significantly extended.

In one embodiment, the first electrode 20 is an anode, and the second electrode 50 is a cathode. In another embodiment, the first electrode 20 can be a cathode, and the second electrode 50 can be an anode. In the top light-emitting OLED display device, the second electrode 50 is a semi-reflective electrode which can reflect a portion of light. A microcavity is formed between the self-reflective second electrode 50 and the total reflective substrate 10, thereby enhancing interference of light in the microcavity. The microcavity is an optical microcavity. Size of the optical microcavity of a top cavity is as small as a wavelength of resonant light in at least one direction. In the present embodiment, the microcavity is formed from the semi-reflective second electrode 50, the light-emitting functional layer 40, the pixel defining layer 30, the first electrode 20, and the total reflective substrate 10. A length of the microcavity is the same as a total thickness of semi-reflective second electrode 50, the light-emitting functional layer 40, the pixel defining layer 30, the first electrode 20, and the total reflective substrate 10. The length of the microcavity can be determined by different structures. By choosing an appropriate cavity length, interference of light is enhanced. As a result, luminous efficiency of an OLED device is improved. Preferably, lengths of the microcavity range from 300 to 900 nm.

In one embodiment, as shown in FIGS. 1 to 4, the first electrode 20 is an anode which is a stacked structure of ITO/Ag/ITO. The second electrode 50 is a cathode made of one or more of Yb, Ca, Mg, and Ag. In the following embodiments, the first electrode 20 is an anode, and the second electrode 50 is a cathode.

In one embodiment, the light-emitting functional layer 40 is disposed in the microcavity. The light-emitting functional layer 40 includes the hole transport layer 401, the luminous material layer 402, and the electron transport layer 403. To inject electrons and holes into the luminous material layer 402 more efficiently, the light-emitting functional layer 40 can further include an electron injection layer disposed between the cathode and the electron transport layer 403 and a hole injection layer disposed between the hole transport layer 401 and the anode.

Material of the hole transport layer 401 has high hole mobility, high thermal stability, and good electron and exciton blocking ability. In one embodiment, material of the hole transport layer 401 is one or more of 4,4',4"-Tris[2-naphthyl(phenyl)amino]triphenylamine (2-TNATA), n-Propyl bromide (nPB), and 4,4'-Cyclohexylidenebis[N,N-bis(4-methylphenyl)benzenamine] (TAPC). Thicknesses of the hole transport layer 401 range from 40 to 150 nm. The hole transport layer 401 is deposited on the anode 20 by vacuum deposition.

Material of the luminous material layer 402 is an organic semiconductive luminous material, including a red light-emitting molecule, a green light-emitting molecule, and a blue light-emitting molecule. Material of the luminous material layer 402 may also only include a white light-emitting molecule. In one embodiment, material of the luminous material layer 402 is an organic blue light-emitting material with a low molecular weight. Thicknesses of the luminous material layer 402 range from 20 to 50 nm.

Material of the electron transport layer 403 has high hole mobility, high thermal stability, and good electron and exciton blocking ability. In one embodiment, the material of the electron transport layer 403 is one or more of 2,2',2"-(1,3,5-Benzinetriyl)-tris(1-phenyl-1-H-benzimidazole) (TPBi), Bathophenanthroline (BPhen), and 1,3,5-Tris(3-pyridyl-3-phenyl)benzene (TmPyPB). Thicknesses of the electron transport layer 403 range from 20 to 80 nm. The electron transport layer 403 is deposited on the luminous material layer 402 by vacuum deposition.

When a working voltage is applied to the anode and the cathode, holes provided by the anode and electrons provided by the cathode are injected into the luminous material layer. The holes and the electrons meet in the luminous material layer and recombine to form electron-hole pairs. Energy of recombination will be released as a photon of light. Different luminous molecules in the luminous material layer emit different colors of light. The light is evenly emitted from two sides of the light-emitting functional layer.

A refractive index of an organic matter is greater than that of air and glass, and is about 1.6 to 1.7. The cathode is an ultrathin metal material layer with a refractive index of about 1.8 to 2.0. After light is emitted from the light-emitting functional layer 40, the light is totally reflected by the substrate 10 in a direction and is reflected by the cathode 50 in an opposite direction. The optical coupling layer 60 is disposed on the cathode 50. A refractive index of the optical coupling layer 60 is greater than that of the light-emitting layer 40 and the cathode 50, which means the refractive index of the optical coupling layer 60 is larger than 2.0. By disposing the optical coupling layer 60 with a high refractive index, the reflective index of the cathode 50 can be increased. As a result, an amount of light, which is reflected in a cavity after being emitted into the cathode 50, is increased. Hence, light reflected by the substrate 10 into the microcavity, light reflected by the cathode 50 into the microcavity, and light emitted or reflected from different angles and positions will interfere with each other in the microcavity. By disposing a cavity with a certain length, intensity of light, which has a certain wavelength, can be selectively enhanced, and intensity of light, which has other wavelengths, can be weakened. As a result, optical coupling efficiency can be increased. Because light interference occurs in the microcavity, the greater the refractive index of the optical coupling layer 60 is, the greater the reflective index of the cathode 50. Thereby, light interference effect in the microcavity is enhanced, and luminous efficiency of an OLED display device is improved as well. External quantum efficiency of the OLED display device is significantly improved.

Meanwhile, the encapsulation layer 70 is further disposed on the optical coupling layer 60. The encapsulation layer 70 has refractive indices of about 1 to 1.5, which are less than the refractive index of the optical coupling layer 60. When light emits from the optical coupling layer 60 (denser medium) into the encapsulation layer 70 (less dense medium), the light will be totally reflected, which means that light is confined inside the optical coupling layer 60 and the encapsulation layer 70 and cannot be emitted to the air because of a waveguide mode. Consequently, the refractive index of the optical coupling layer 60 must be as small as possible to reduce total reflection of light, thereby reducing loss of light from the waveguide mode and improving luminous efficiency.

A coupling layer with a high refractive index is disposed on an outer side of the cathode 50 to increase reflectance of light at the cathode 50. A coupling layer with a low refractive index is disposed on a side, which is near the encapsulation layer 70, of the cathode 50 to reduce a total reflectance of light at the encapsulation layer 70. In the present disclosure, at least two coupling layers are disposed on a light-emitting functional layer in a direction in which light emits from the light-emitting functional layer, and refractive indices of at least two optical coupling layers are gradually decreased. By the above improvements, an external quantum efficiency of the OLED device is significantly improved. Under a circumstance of same brightness, drive current required for the OLED display panel is substantially reduced, power consumption of the OLED display panel is reduced, and a lifetime of the OLED device is greatly extended. Furthermore, working brightness and a maximum brightness of the OLED device are significantly increased because of an improvement in luminous efficiency. Therefore, practicalities of the OLED device are greatly improved, and the OLED device can be more widely used and has stronger market competitiveness.

Luminous efficiency of the OLED display panel will be affected by the amount of layer of the optical coupling layers, a thickness of each of the optical coupling layers, and a refractive index of each of the optical coupling layers. A setting of the optical coupling layer of the OLED display panel of the present disclosure will be further described with reference to specific embodiments.

In one embodiment, the optical coupling layer 60 is an organic material with a high refractive index and a low molecular weight. The optical coupling layer 60 can also be a non-organic material with a high refractive index. In one embodiment, material of the optical coupling layer 60 is one or more of 2-TNATA, nPB, and TAPC. A total thickness of the optical coupling layer 60 ranges from 50 nm to 120 nm (preferably 80 nm). In the following embodiments, the total thickness of the optical coupling layer 60 is 80 nm. If the total thickness of the optical coupling layer 60 is too thick, a light path in the optical coupling layer 60 of the OLED display panel will be too long, that is, light is absorbed too much, and the luminous efficiency is greatly affected. Furthermore, a total thickness of the OLED display panel will be too thick, which is not beneficial to form a thin and light-weight OLED display panel. On the other hand, if the total thickness of the optical coupling layer 60 is too thin, light cannot be reflected, and optical coupling effect cannot be achieved effectively.

In one embodiment, as shown in FIG. 1, the optical coupling layer 60 includes a first optical coupling layer 601, a second optical coupling layer 602, a third optical coupling layer 603, and a fourth optical coupling layer 604, which are disposed in a stack in a direction in which light emits from the light-emitting layer 40. The first optical coupling layer 601, the second optical coupling layer 602, the third optical coupling layer 603, and the fourth optical coupling layer 604 have the same thickness (20 nm). Refractive indices of the first optical coupling layer 601, the second optical coupling layer 602, the third optical coupling layer 603, and the fourth optical coupling layer 604 are gradually decreased.

In the present embodiment, the first optical coupling layer 601, which has the largest refractive index of layers of the OLED display device, is disposed on a side, which is near the cathode 50, of the light-emitting functional layer 40. Therefore, reflective indices of the first optical coupling layer 601 and the cathode 50 can be the largest, which substantially and effectively enhances light interference in a microcavity. Meanwhile, thickness of the optical coupling layer 60 is even, and refractive index of the optical coupling layer 60 is gradually decreased. When light emits from the optical coupling layer 60 (denser medium) into the encapsulation layer 70 (less dense medium), the light travels uniformly and slowly. Total reflection of the light is greatly reduced and luminous efficiency is improved.

In the present embodiment, it is also possible that refractive indices of at least two of the first optical coupling layer 601, the second optical coupling layer 602, the third optical coupling layer 603, and the fourth optical coupling layer 604 are gradually increased, which can also achieve the purpose of improving luminous efficiency of the OLED display panel. Furthermore, the number of layers included in the optical coupling layer 60 may also be three, five, or other numbers, and is not limited to the four layers shown by the present embodiment. The more layers, which have same thicknesses and have gradually decreased refractive indices, the optical coupling layer 60 has, the lower the total reflectance of light the optical coupling layer 60 has, and the higher luminous efficiency the optical coupling layer 60 has. On the contrary, the fewer layers the optical coupling layer 60 has, the thicker the first optical coupling layer 601, which is near the cathode, is, and the more light the optical coupling layer 60 and the cathode 50 reflect into a microcavity, the better the effect of the light interference enhanced.

Figure 2:
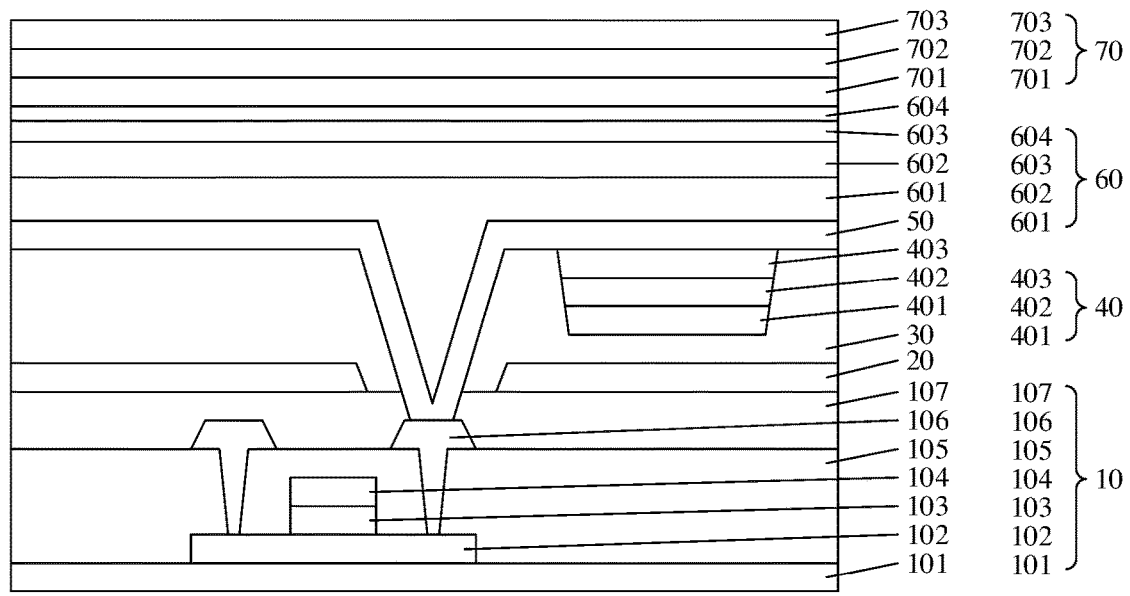
FIG. 2 is a schematic structural diagram of a second OLED display panel provided by an embodiment of the present disclosure.

In one embodiment, as shown in FIG. 2, the optical coupling layer 60 includes a first optical coupling layer 601, a second optical coupling layer 602, a third optical coupling layer 603, and a fourth optical coupling layer 604, which are disposed in a stack in a direction in which light emits from the light-emitting layer 40. Thicknesses of the first optical coupling layer 601, the second optical coupling layer 602, the third optical coupling layer 603, and the fourth optical coupling layer 604 are gradually decreased. Refractive indices of the first optical coupling layer 601, the second optical coupling layer 602, the third optical coupling layer 603, and the fourth optical coupling layer 604 are gradually decreased.

In the present embodiment, the first optical coupling layer 601, which has the largest refractive index and the largest thickness among layers of the OLED display device, is disposed on a side, which is near the cathode 50, of the light-emitting functional layer 40. Therefore, reflective indices of the first optical coupling layer 601 and the cathode 50 can be the largest, which substantially and effectively enhances light interference in a microcavity. Furthermore, a refractive index of the optical coupling layer 60 is gradually decreased. When light emits from the optical coupling layer 60 (denser medium) into the encapsulation layer 70 (less dense medium), the light travels uniformly and slowly. Total reflection of the light is greatly reduced and luminous efficiency is improved.

In the present embodiment, it is also possible that refractive indices of at least two of the first optical coupling layer 601, the second optical coupling layer 602, the third optical coupling layer 603, and the fourth optical coupling layer 604 are gradually increased, which also can achieve the purpose of improving luminous efficiency of the OLED display panel. Furthermore, the number of layers of the optical coupling layer 60 may also be three, five, or other numbers, and is not limited to the four layers shown by the present embodiment. The more layers, which have same thicknesses and have gradually decreased refractive indices, the optical coupling layer 60 has, the lower the total reflectance of light the optical coupling layer 60 has, and the higher luminous efficiency the optical coupling layer 60 has. On the contrary, the fewer layers the optical coupling layer 60 has, the thicker the first optical coupling layer 601, which is near the cathode, is, and the more light the optical coupling layer 60 and the cathode 50 reflect into a microcavity, the better the effect of the light interference enhanced.

Figure 3:
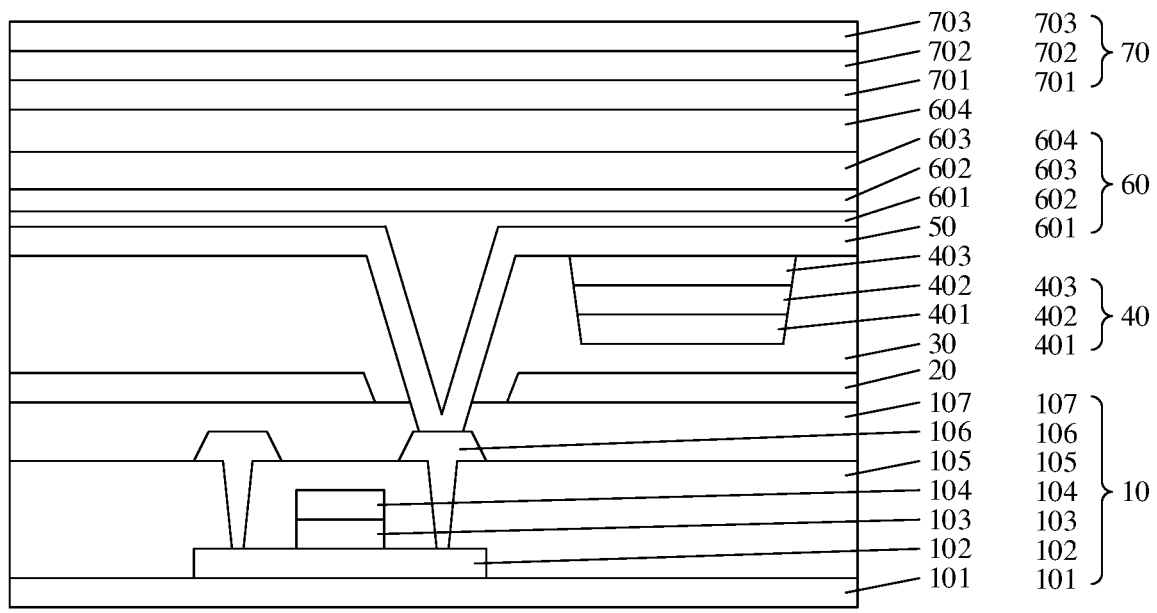
FIG. 3 is a schematic structural diagram of a third OLED display panel provided by an embodiment of the present disclosure.

In one embodiment, as shown in FIG. 3, the optical coupling layer 60 includes a first optical coupling layer 601, a second optical coupling layer 602, a third optical coupling layer 603, and a fourth optical coupling layer 604, which are disposed in a stack in a direction in which light emits from the light-emitting layer 40. Thicknesses of the first optical coupling layer 601, the second optical coupling layer 602, the third optical coupling layer 603, and the fourth optical coupling layer 604 are gradually increased. Refractive indices of the first optical coupling layer 601, the second optical coupling layer 602, the third optical coupling layer 603, and the fourth optical coupling layer 604 are gradually decreased.

In the present embodiment, the first optical coupling layer 601, which has the largest refractive index among layers of the OLED display device, is disposed on a side, which is near the cathode 50, of the light-emitting functional layer 40. Therefore, reflective indices of the first optical coupling layer 601 and the cathode 50 can be the largest, which substantially and effectively enhances light interference in a microcavity. Furthermore, a refractive index of the optical coupling layer 60 gradually decreased. When light emits from the optical coupling layer 60 (denser medium) into the encapsulation layer 70 (less dense medium), the light travels uniformly and slowly. Total reflection of the light is greatly reduced and luminous efficiency is improved.

In the present embodiment, it is also possible that refractive indices of at least two of the first optical coupling layer 601, the second optical coupling layer 602, the third optical coupling layer 603, and the fourth optical coupling layer 604 are gradually increased, which also can achieve the purpose of improving luminous efficiency of the OLED display panel. Furthermore, the number of layers of the optical coupling layer 60 may also be three, five, or other numbers, and is not limited to the four layers shown by the present embodiment. The more layers, which have same thicknesses and have gradually decreased refractive indices, the optical coupling layer 60 has, the lower the total reflectance of light the optical coupling layer 60 has, and the higher luminous efficiency the optical coupling layer 60 has. On the contrary, the fewer layers the optical coupling layer 60 has, the thicker the first optical coupling layer 601, which is near the cathode, is, and the more light the optical coupling layer 60 and the cathode 50 reflect into a microcavity, the better the effect of the light interference enhanced.

Figure 4:
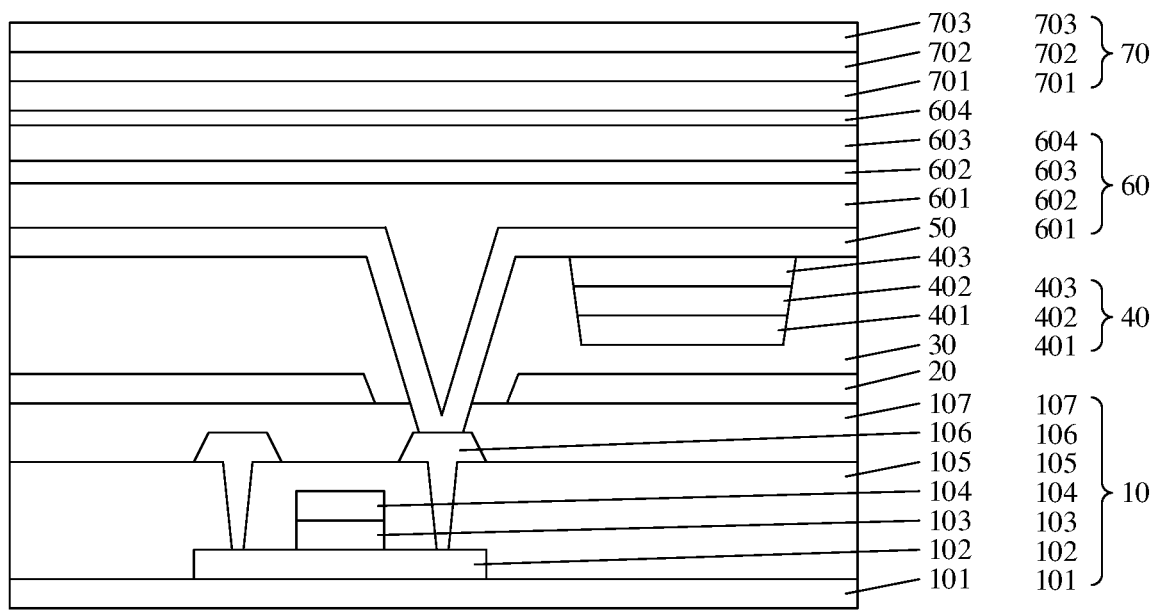
FIG. 4 is a schematic structural diagram of a fourth OLED display panel provided by an embodiment of the present disclosure.

In one embodiment, as shown in FIG. 4, the optical coupling layer 60 includes a first optical coupling layer 601, a second optical coupling layer 602, a third optical coupling layer 603, and a fourth optical coupling layer 604, which are disposed in a stack in a direction in which light emits from the light-emitting layer 40. A thickness of the first optical coupling layer 601 is greater than that of the third optical coupling layer 603. The thickness of the third optical coupling layer 603 is greater than that of the second optical coupling layer 602. The thickness of the second optical coupling layer 602 is greater than that of the fourth optical coupling layer 604. Thicknesses of the first optical coupling layer and that of the fourth optical coupling layer 604 are gradually increased. Refractive indices of the first optical coupling layer 601, the second optical coupling layer 602, the third optical coupling layer 603, and the fourth optical coupling layer 604 are respectively 40 nm, 15 nm, 25 nm, and 10 nm. Refractive indices of the first optical coupling layer 601, the second optical coupling layer 602, the third optical coupling layer 603, and the fourth optical coupling layer 604 are gradually decreased.

In the present embodiment, the first optical coupling layer 601, which has the largest refractive index and the largest thickness among layers of the OLED display device, is disposed on a side, which is near the cathode 50, of the light-emitting functional layer 40. Therefore, reflective indices of the first optical coupling layer 601 and the cathode 50 can be the largest, which substantially and effectively enhances light interference in a microcavity. Furthermore, a refractive index of the optical coupling layer 60 is gradually decreased. When light emits from the optical coupling layer 60 (denser medium) into the encapsulation layer 70 (less dense medium), the light travels uniformly and slowly. Total reflection of the light is greatly reduced and luminous efficiency is improved.

In the present embodiment, it is also possible that refractive indices of at least two of the first optical coupling layer 601, the second optical coupling layer 602, the third optical coupling layer 603, and the fourth optical coupling layer 604 are gradually increased, which also can achieve the purpose of improving luminous efficiency of the OLED display panel. Furthermore, the number of layers of the optical coupling layer 60 may also be three, five, or other numbers, and is not limited to the four layers shown by the present embodiment. The more layers, which have same thicknesses and have gradually decreased refractive indices, the optical coupling layer 60 has, the lower the total reflectance of light the optical coupling layer 60 has, and the higher luminous efficiency the optical coupling layer 60 has. On the contrary, the fewer layers the optical coupling layer 60 has, the thicker the first optical coupling layer 601, which is near the cathode, is, and the more light the optical coupling layer 60 and the cathode 50 reflect into a microcavity, the better the effect of the light interference enhanced.

In the meantime, the present disclosure provides an OLED display device, including an OLED display panel. The OLED display panel includes: a substrate; a first electrode disposed on the substrate; a light-emitting functional layer disposed on the first electrode, wherein the light-emitting functional layer includes a hole transport layer, a luminous material layer, and an electron transport layer; a second electrode disposed on the light-emitting functional layer; and at least two optical coupling layers disposed on the second electrode. Refractive indices of at least two optical coupling layers are gradually decreased in a direction in which light emits from the light-emitting functional layer.

The present embodiment provides a display device including an OLED display panel. A plurality of optical coupling layers with certain thicknesses are disposed on the OLED display panel in the direction in which light emits from the OLED display panel. Refractive indices of the optical coupling layers are gradually decreased. By adjusting an interaction between an angular width and a multiple-beam interference in the OLED display panel, efficiency of optical coupling is improved. Therefore, luminous efficiency of the OLED display panel is greatly improved. Brightness of the OLED display panel is increased, drive current and power consumption of the OLED display panel is reduced, and a lifetime of the OLED display panel is significantly extended.

In one embodiment, thicknesses of the optical coupling layers are gradually decreased in the direction in which light emits from the light-emitting functional layer.

In one embodiment, refractive indices of at least two optical coupling layers are gradually decreased in the direction in which light emits from the light-emitting functional layer.

In one embodiment, a total thickness of the optical coupling layers ranges from 50 nm to 120 nm.

In one embodiment, a total thickness of the optical coupling layers is 80 nm.

In one embodiment, thicknesses of different optical coupling layers are the same.

In one embodiment, thicknesses of at least two optical coupling layers are different.

In one embodiment, thicknesses of the optical coupling layers are gradually decreased in the direction in which light emits from the light-emitting functional layer.

In one embodiment, thicknesses of the optical coupling layers are gradually increased in the direction in which light emits from the light-emitting functional layer.

In one embodiment, material of the optical coupling layer is an organic molecular material.

A principle of the display device provided by the present embodiment is similar to that of the OLED display panel in the above embodiments Specifically, the principle can be referenced in the above embodiments, and will not be described in detail here.

According to the above embodiments, the present disclosure provides an OLED display panel and a display device. The OLED display panel includes a substrate, a light-emitting functional layer disposed on the substrate, and at least two optical coupling layers disposed on the light-emitting functional layer and disposed in a direction in which light emits from the light-emitting functional layer. Refractive indices of at least two optical coupling layers are gradually decreased in the direction in which light emits from the light-emitting functional layer. A plurality of optical coupling layers with certain thicknesses are disposed on the OLED display panel in the direction in which light emits from the OLED display panel. Refractive indices of the optical coupling layers are gradually decreased. By adjusting an interaction between an angular width and a multiple-beam interference in the OLED display panel, efficiency of optical coupling is improved. Therefore, luminous efficiency of the OLED display panel is greatly improved. Brightness of the OLED display panel is increased, drive current and power consumption of the OLED display panel is reduced, and a lifetime of the OLED display panel is significantly extended.

To sum up, the present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An organic light-emitting diode (OLED) display panel, comprising:
   a substrate;
   a light-emitting functional layer disposed on the substrate; and
   at least two optical coupling layers disposed on the light-emitting functional layer and disposed in a direction in which light emits from the light-emitting functional layer;
   wherein refractive indices of the at least two optical coupling layers are gradually decreased in the direction in which light emits from the light-emitting functional layer; and
   thicknesses of the at least two optical coupling layers are gradually decreased in the direction in which light emits from the light-emitting functional layer.

2. The OLED display panel of claim 1, wherein refractive indices of all optical coupling layers are gradually decreased in the direction in which light emits from the light-emitting functional layer.

3. The OLED display panel of claim 1, wherein a total thickness of the at least two optical coupling layers ranges from 50 nm to 120 nm.

4. The OLED display panel of claim 3, wherein the total thickness of the at least two optical coupling layers is 80 nm.

5. The OLED display panel of claim 1, wherein thicknesses of different optical coupling layers are the same.

6. The OLED display panel of claim 1, wherein thicknesses of the at least two optical coupling layers are different.

7. The OLED display panel of claim 6, wherein thicknesses of the at least two optical coupling layers are gradually increased in the direction in which light emits from the light-emitting functional layer.

8. The OLED display panel of claim 1, wherein material of the at least two optical coupling layers is an organic molecular material.

9. An organic light-emitting diode (OLED) display device, comprising:
   an OLED display panel;
   wherein the OLED display panel comprises a substrate, a light-emitting functional layer disposed on the substrate, and at least two optical coupling layers disposed on the light-emitting functional layer and disposed in a direction in which light emits from the light-emitting functional layer;
   wherein refractive indices of the at least two optical coupling layers are gradually decreased in the direction in which light emits from the light-emitting functional layer; and
   thicknesses of the at least two optical coupling layers are gradually decreased in the direction in which light emits from the light-emitting functional layer.

10. The OLED display device of claim 9, wherein refractive indices of all optical coupling layers are gradually decreased in the direction in which light emits from the light-emitting functional layer.

11. The OLED display device of claim 9, wherein a total thickness of the at least two optical coupling layers ranges from 50 nm to 120 nm.

12. The OLED display device of claim 11, wherein the total thickness of the at least two optical coupling layers is 80 nm.

13. The OLED display device of claim 9, wherein thicknesses of different optical coupling layers are the same.

14. The OLED display device of claim 9, wherein thicknesses of the at least two optical coupling layers are different.

15. The OLED display device of claim 14, wherein thicknesses of the at least two optical coupling layers are gradually increased in the direction in which light emits from the light-emitting functional layer.

16. The OLED display device of claim 9, wherein material of the at least two optical coupling layers is an organic molecular material.

17. An organic light-emitting diode (OLED) display panel, comprising:
   a substrate;
   a light-emitting functional layer disposed on the substrate; and
   at least two optical coupling layers disposed on the light-emitting functional layer and disposed in a direction in which light emits from the light-emitting functional layer;
   wherein refractive indices of the at least two optical coupling layers are gradually increased in the direction in which light emits from the light-emitting functional layer; and
   thicknesses of the at least two optical coupling layers are gradually decreased in the direction in which light emits from the light-emitting functional layer.

* * * * *